United States Patent [19]

Swart

[11] Patent Number: 5,045,780
[45] Date of Patent: Sep. 3, 1991

[54] ELECTRICAL TEST PROBE CONTACT TIP

[75] Inventor: Mark A. Swart, Upland, Calif.

[73] Assignee: Everett/Charles Contact Products, Inc.

[21] Appl. No.: 445,979

[22] Filed: Dec. 4, 1989

[51] Int. Cl.$^5$ .......................... G01R 1/02; G01R 1/04
[52] U.S. Cl. .............................. 324/158 P; 324/72.5; 324/158 F; 439/482
[58] Field of Search ............... 324/158 P, 158 F, 72.5; 439/482

[56] References Cited

U.S. PATENT DOCUMENTS

| 3,861,770 | 1/1975 | Horak | 439/307 |
|---|---|---|---|
| 4,105,970 | 8/1978 | Katz . | |
| 4,116,523 | 9/1978 | Coberly et al. | 324/158 P |
| 4,686,465 | 8/1987 | Kruger | 439/482 |
| 4,740,746 | 4/1988 | Pollock et al. | 324/158 F |
| 4,761,146 | 8/1988 | Sohoel | 439/584 |

FOREIGN PATENT DOCUMENTS 1765461  7/1971  Fed. Rep. of Germany ...... 439/482

OTHER PUBLICATIONS

"Test Probe having Concave Tip with Pointed Nipple", by Jakubowski, West. Elec. Tech. Aug., #40, 10/75, pp. 11–12.
"Spring Plunger Contact", by Buyck et al., IBM Tech. Proc. Bull., vol. 15, #1, 6/72, p. 58.
"Pad Deformation Contactor", by Byrnes et al., IBM Tech. Proc. Bull., vol. 21, #11, 4/79, pp. 4511–4512.

Ostby & Barton Co., Drawing No. 110684 (one page), 6/76.

Primary Examiner—Kenneth A. Wieder
Assistant Examiner—William J. Burns
Attorney, Agent, or Firm—Christie, Parker & Hale

[57] ABSTRACT

An electrical test probe comprises an outer barrel, and a plunger extending axially through the barrel and having an outer portion extending through an open end of the barrel and terminating in a contact tip outside the barrel for contact with a test point. The plunger is supported within the barrel by spring pressure for allowing spring biased relative axial motion between the plunger and the barrel. The plunger is rotatable about its axis during relative axial motion between the plunger and barrel against the bias of the spring so that rotation of the plunger causes enhanced contact between the probe and a test point on a circuit board under test. The contact tip comprises a head having a substantially continuous outer blade edge extending around a periphery of the head and positioned thereon to engage the test point on the board, and at least one further substantially continuous inner blade edge inside the outer blade edge and positioned preferably concentrically with respect to the outer blade edge also for contact with the test point on the board. The inner and outer blade edges are able to spin about the axis of the plunger during their contact with the test point without causing the plunger to bind in the barrel as the head is rotated during contact with an irregularly shaped test point on the board.

8 Claims, 1 Drawing Sheet

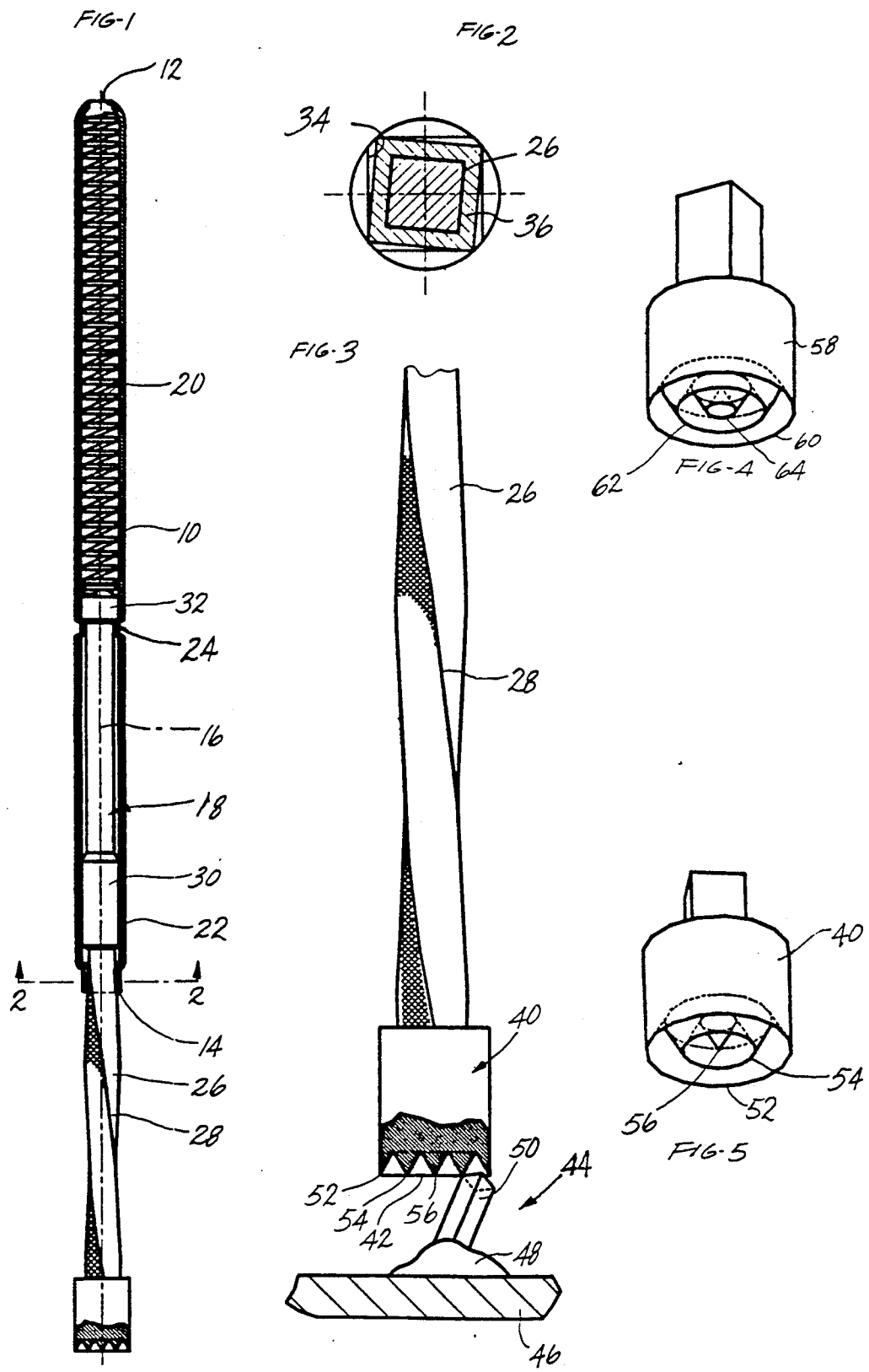

ELECTRICAL TEST PROBE CONTACT TIP

FIELD OF THE INVENTION

This invention relates to electrical contact test probes, and more particularly to spring-loaded test probes for use in electrical continuity testing of a variety of electrical devices. These test probes are generally used to produce contact between large numbers of test points on an electrical unit under test and electrical diagnostic or testing equipment.

BACKGROUND OF THE INVENTION

In the automatic testing of electrical circuits, test probes of various configurations are used, depending upon such factors as the type of electrical device under test, the spacing between test points, and the like. The present invention is applicable to a type of contact test probe which is rotated as it moves into contact with a test point or node on the unit under test.

In order to appreciate the improvements provided by this invention, one type of prior art test probe will first be described. This test probe assembly comprises a conventional spring loaded contact probe generally including an outer receptacle, a removable plunger or probe member, and a barrel in the receptacle. In such devices, the plunger or probe member is mounted in the barrel and extends outwardly from it. The barrel includes a spring so that the plunger or probe member is supported in the barrel by spring pressure. The probe member can be biased outwardly a selected distance by the spring and may be biased or depressed inwardly into the barrel a selected distance under force directed against the spring. The probe member generally has a probing end or tip which makes contact with selected test points on the electrical device under test. A printed circuit board would be an example of a unit under test.

There are many applications in which the probing end of the test probe must grip onto a particular test point or node during probing. Therefore, the test probe must be designed so that it stays in good contact with the circuit test point being probed. In order to ensure good contact during probing, prior art test probes have included a large number of different probe tip configurations designed to grip onto the test node to make good contact when spring pressure is applied to the probe during testing.

Examples of instances in which good contact is required between the test probe and the circuit test node include where the board under test has been in a dirty environment, or where no de-fluxing was conducted after soldering; and therefore, the test probe must grip or bite into the conductive surface of the test node to ensure circuit continuity.

A conventional way to ensure good probe contact is by use of a "helical" test probe assembly which includes a cylindrical barrel having an axial passage and a movable test probe which rotates as it slides axially in the passage. The barrel has a coil spring inside it which applies a spring bias to a plunger during use. The plunger can have a small lateral post extending outwardly and engaged in a spiral groove extending lengthwise along the barrel. The post engaged in the groove provides a means for controlling movement of the probe relative to the barrel during use. When the plunger portion of the probe assembly is depressed against the spring pressure, the post rides upwardly in the spiral groove and causes the probe shaft to rotate about its axis during probing. By twisting about its axis, the bottom contact tip portion of the probe can bite into the contact point on the unit under test to provide better contact during testing.

An improved helix probe is described in U.S. patent application Ser. No. 07/431,477, filed Nov. 3, 1989, and entitled "Electrical Test Probe Having Rotational Control of the Probe Shaft." This application is owned lo by the assignee of this application and is incorporated herein by the reference.

There are certain drawbacks to using a helical probe with a conventional probe tip configuration. Problems can arise when probing test points which project from the board surface nonuniformly. An example is a solder bump in which an exposed lead from a chip on the opposite side of the board projects through the solder bump at an angle. If this test point is being probed by a helix probe with a conventional contact tip, such as a serrated head or a funnel or cone shaped head, the tip can be get stuck as it turns, which can break off the lead, cause the probe to bind, or break off the head of the contact tip. Contact with the angled lead tends to pull the head of the probe over to one side and can bind the probe in a necked-down lower portion of the helix probe. There tends to be very little room for lateral motion of the probe relative to the barrel in this portion of the probe, whereas a certain amount of play would otherwise resist binding.

The present invention provides a contact tip for a test probe of the helix probe variety in Which contact can be made with an irregular test node while the probe is being rotated, without causing binding of the probe or any other undesired resistance to the normal rotation of the probe.

SUMMARY OF THE INVENTION

Briefly, one embodiment of this invention provides an electrical test probe comprising an outer barrel, a plunger extending axially through the barrel and having an outer portion extending through an open end of the barrel and terminating in a contact tip outside the barrel for contact with a test point, and means for supporting the plunger within the barrel by spring pressure for allowing spring-biased relative axial motion between the plunger and the barrel. Actuating means within the barrel cause the plunger to rotate about its axis during relative axial motion between the plunger against the bias of the spring. This rotation thereby causes the contact tip of the probe to rotate about its axis with the plunger. The contact tip comprises a head having a substantially continuous outer blade edge extending around an outer periphery of the head. The outer blade edge is positioned to engage a test point on the unit under test. At least one further substantially continuous inner blade edge is spaced inside the outer blade edge and is positioned on the head to also engage the test point on the unit under test. Upon contact with a projecting irregular surface of the test point, the inner and outer blade edges continue to rotate as the plunger rotates about its axis under spring biased engagement with the test point material, without the inner and outer blade edges binding the plunger in the barrel.

In a preferred embodiment, the inner and outer blade edges are of generally circular configuration and are concentrically aligned on the axis of rotation of the plunger. There are preferably two or three of these blade edges on the contact tip of the plunger, although more can be used if desired.

During use, when the blade edges on the head contact an irregularly shaped projecting test point on a board, such as a test point having a solder bump with a lead bent at an angle, either one or both of the blade edges engages the angular lead and the blade edges keep spinning about the axis of the probe no matter where the head lands on the test point. As a result, the test probe head does not have a tendency to relocate the probe or otherwise cause any binding sideways force on the plunger relative to the barrel of the probe.

These and other aspects of the invention will be more fully understood by referring to the following detailed description and the accompanying drawings.

BRIEF DESCRIPTION OF THE DRAWINGS

FIG. 1 is a cross-sectional view, partly broken away, illustrating a helix test probe and contact tip according to principles of this invention;

FIG. 2 is a cross-sectional view taken on line 2—2 of FIG. 1;

FIG. 3 is an enlarged fragmentary view, partly broken away and partly in cross-section, showing use of the contact tip of this invention;

FIG. 4 is a perspective view illustrating one configuration of a contact tip; and FIG. 5 is a perspective view illustrating an alternative configuration of a contact tip.

DETAILED DESCRIPTION

FIGS. 1 and 2 illustrate one embodiment of a helix probe for use in making electrical contact between a test point on a unit under test and electrical diagnostic and testing equipment (not shown). The helix probe includes an elongated, cylindrical outer barrel 10 having a hollow interior extending from one open end 12 to an opposite open end 14 of the barrel. The open ends of the barrel are both circular in cross-section. The barrel has a major axis 16, and the open ends of the barrel are centered on this axis.

An elongated movable plunger 18 slides axially inside the barrel while also rotating about its axis 16. A portion of the plunger normally extends outside the barrel, and during probing, the plunger slides axially into the barrel against the bias of a spring 20. The barrel has a tubular first section 22 and a necked-down region 24 which forms an annular wall inside the barrel to provide a stop for plunger travel in the barrel. The plunger portion 26 outside the barrel is preferably square in cross-sectional configuration, as shown in FIG. 2. The plunger is also twisted about its axis to form a helical configuration 28 which wraps around the axis of the plunger at a fixed angular pitch. The plunger extends into the inside of the first section 22 of the barrel where a first cylindrical bearing surface 30 on the plunger rides against the inside diameter of the barrel during travel of the plunger in the barrel. The end of the plunger includes a cylindrical bearing surface 32 which also rides on the inside of the barrel. The coil spring 20 inside the barrel applies spring pressure to the bearing portion 32 of the plunger. The helix portion of the probe shaft extends through a pilot hole 34 in the end of the barrel. The pilot hole extends through a necked-down end portion 36 of the barrel which is twisted along its length to match the helical shape of the probe shaft. This arrangement is best illustrated in FIG. 2.

During use, the barrel of the probe assembly is held in a fixed position; and as the probe is lowered toward the test point of the unit under test, spring pressure is applied to the tip of the plunger, causing the shaft to travel axially into the barrel against the bias of the spring. The cooperating square fixed pilot hole and square cross-sectional configuration of the helical shaft of the plunger create an interference, if one is normally rotated relative to the other; but they cause the plunger to rotate about its axis as the plunger travels axially into the barrel. The cooperating geometric shapes provide a guide means in which axial force applied to the probe causes the plunger control surface to engage the pilot hole and twist the plunger about its axis as the plunger travels relative to the pilot hole. The engaging surfaces of the plunger control surface and pilot hole create the interference that applies a torque to the plunger that causes it to twist about its axis.

During use of the probe assembly, the outer barrel is held in a fixed non-rotational position. Preferably, the probe assembly is attached to a fixture for cycling the probe toward a unit under test. The fixture is then lowered toward the unit under test so that the contact tip of the plunger engages a test point or node on the unit under test. When the plunger is cycled downwardly against the test node, spring pressure is applied against the bias of the spring. This force causes the plunger to travel into the barrel and compress the spring. During cycling, the engaging helical plunger shaft and pilot hole produce a controlled rotation of the plunger about the axis of the barrel as the probe travels into the barrel against the bias of the spring. In the illustrated embodiment, the plunger twists about 100° to about 110° about its axis during a full stroke length of the probe.

In a use of the probe assembly in which it is desirable to normally produce good mechanical contact between the test point and the tip of the plunger, the rotational action of the plunger during its axial travel into the barrel causes the tip of the shaft to bite into the surface of the test point on the unit under test. This probe arrangement can be useful in testing of test points on a unit under test which has been in a dirty environment, or in which de-fluxing was not thoroughly carried out before testing, or where a protective conformable coating has been applied.

The helix probe described thus far is one example of a means for producing rotation of the plunger about its axis during spring biased axial travel of the plunger when probing against a test node in which good mechanical contact is desirable. Other examples of helix probes for producing such rotational and axial travel of the probe head are either known in the prior art, or are described in the applicant's co-pending application described above.

FIGS. 1 and 3 illustrate a contact tip portion of a plunger according to principles of this invention. The contact tip comprises an enlarged cylindrical probe head 40 having a contact face 42 on a side of the probe that faces toward and contacts a node or test point 44 on a printed circuit board 46 under test. In the illustrated embodiment, the node comprises a solder bump 48 which normally projects irregularly from the printed circuit board. The end of an electrical lead 50 from a component on an opposite side of the board commonly will project at an angle away from the solder bump. During probing, the probe head 40 is rotated about the axis 16 of the plunger as the plunger is forced into spring pressure contact with the test node. A rotating probe head of conventional configuration can have problems when probing a projecting irregularly shaped test node, especially one having an angular lead as illustrated in FIG. 3. For instance, a conventional probe head having a contact tip with spaced apart serrations, or a probe head with a tapered or funnel shaped configuration, can both bind when rotating into contact with a lead projecting from the solder bump. Typically, the contact gets stuck in the irregularly shaped test node as it turns, and the lead can be broken off, the probe can bind, or it can break off the head of the probe. The projecting lead can pull the head to one side causing it to bind, and this particularly becomes a problem in a helix probe in which a necked-down bottom portion of the probe allows for very little play between the moving plunger and the barrel at the bottom of the probe.

FIGS. 1, 3 and 5 illustrate one embodiment of the invention in which the contact face 42 of the probe head 40 comprises a continuous circular outer blade edge 52 extending around the outer periphery of the head, and a continuous circular inner blade edge 54 spaced inside the outer blade edge 52. In the illustrated embodiment, each blade edge is at the bottom end of a corresponding tapered blade structure, so that the circular blade edge at the apex of the inner and outer blade edges provide the initial contact face for the probe head when contacting the test node 44. In a preferred form of the invention, the circular inner and outer blade edges 52 and 54 are aligned concentrically on the axis 16 of the plunger. The embodiment of FIG. 5 also includes a pointed contact tip 56 aligned on the axis 16 of the plunger at the end of a conical projecting blade structure. Thus, the inner blade edge 54 is spaced from the tip 56 by an intervening V-shaped valley, and similarly, the outer blade edge 52 is separated from the inner blade edge 54 by a separate annular V-shaped valley. These are best illustrated in the cross-section of FIG. 3. Moreover, as best illustrated in FIG. 3, the contact tip 56 and the inner and outer blade edge rings 52 and 54 are all aligned on a common flat plane which is preferably perpendicular, or at least substantially perpendicular, to the axis 16 of the plunger.

FIG. 4 illustrates an alternative embodiment in which an enlarged cylindrical probe head 58 carries three continuous circular blade edge rings 60, 62, and 64, all of which are aligned on the common axis 16 of the plunger. Each adjacent pair of rings is separated by a corresponding annular V-shaped valley; and thus, the inside of the inner ring 64 is formed as a shallow cone.

During use of a helix probe having either configuration of probe head shown in FIG. 4 or 5, when an irregularly shaped test node is contacted during use, such as illustrated in FIG. 3, the series of concentric rings simply spin about the axis of the plunger and cut into the probe, whether it be a projecting solder bump or angled lead. The angular lead 50 can be trapped and kept within one of the ring portions of the head if the head contacts the angular lead. No matter where the angular lead is situated, it will be confined within one of the annular regions within the circular blade structure and does not bend the probe or bind the probe as the concentric blade edge rings during use. Therefore, the probe head does not have a tendency to relocate the plunger or apply a sideways stress, but remains concentrically aligned with the axis of the probe during probing of the irregularly shaped test node.

In addition to being useful with an irregularly shaped test node as illustrated in FIG. 3, the invention also works equally well with flat etched metal traces on a printed circuit board.

The test probe plunger and contact tip also can be used in a conventional spring probe assembly which is not intended to twist about its axis during use. In this instance, there can possibly be a minor amount of translation of the plunger and therefore the probe can be used to make enhanced contact with the test point without following the translating motion of the plunger.

What is claimed is:

1. A plunger for an electrical test probe having an outer barrel and means for supporting the plunger within the barrel by spring pressure for allowing spring biased relative axial motion between the plunger and the barrel so the plunger applies a probing force to a test point on a unit under test, the plunger comprising an elongated shaft for extending axially through the barrel and having an outer portion for extending through an open end of the barrel and terminating in a contact tip outside the barrel for contact with a test point on the unit under test, the contact tip comprising a head having a working end with a substantially continuous outer blade edge of generally V-shaped cross-section extending around a periphery of the head and positioned thereon to engage a test point on the unit under test, and at least one further substantially continuous inner blade edge of generally V-shaped cross-section inside said outer blade edge and positioned on the head to engage the test point on the unit under test, the inner blade edge being spaced inwardly from the outer blade edge to form a continuous annular groove between the blade edges with the groove having side walls converging into the depth of the head, the inner and outer blade edges also having continuous knife edges lying substantially in a common plane at the outermost extremely of the working end of the head, so that upon contact with a projecting surface of the test point, the inner and outer blade edges cooperate to produce spring biased pressure against the surface of the test point to enhance contact with the test point.

2. Apparatus according to claim 1 in which the inner and outer blade edges are substantially circular and are aligned concentrically on the axis of the plunger.

3. Apparatus according to claim 2 in which there are two blade edges on a head.

4. An electrical test probe comprising:
an outer barrel;
a plunger extending axially through the barrel and having an outer portion extending through an open end of the barrel and terminating in a contact tip outside the barrel for contact with a test point on a board under test;
means for supporting the plunger within the barrel by spring pressure for allowing spring biased relative axial motion between the plunger and the barrel; and
means within the barrel for causing the plunger to rotate about its axis during relative axial motion between the plunger and barrel against the bias of the spring, said rotation thereby causing the contact tip to rotate about its axis with the plunger;
the contact tip comprising a head having a working end with a substantially continuous outer blade edge of generally V-shaped cross-section extending around a periphery of the head and positioned thereon to engage a test point on the board, and at least one further substantially continuous inner blade edge of generally V-shaped cross-section inside said outer blade edge and positioned on the head to engage the test point on the board, the inner blade edge being spaced inwardly from the outer blade edge to form a continuous annular groove between the blade edges with the groove having sidewalls converging into the depth of the head, the inner and outer blade edges also having continuous knife edges lying substantially in a common plane at the outermost extremity of the working end of the head, so that upon contact with a projecting irregular surface of the test point, the inner and outer blade edges spin as the plunger rotates about its axis under spring biased engagement with a test point, the cooperating inner and outer blade edges avoiding binding of the plunger in the barrel during their spinning motion to thereby enhance contact with the test point.

5. Apparatus according to claim 4 in which the inner and outer blade edges are substantially circular and are aligned concentrically on the axis of the plunger.

6. Apparatus according to claim 5 in which there are two blade edges on the head.

7. Apparatus according to claim 5 in which there are three blade edges on the head.

8. Apparatus according to claim 5 in which there are three blade edges on a head.

* * * * *

UNITED STATES PATENT AND TRADEMARK OFFICE
CERTIFICATE OF CORRECTION

PATENT NO.  : 5,045,780
DATED       : September 3, 1991
INVENTOR(S) : Mark A. Swart It is certified that error appears in the above-identified patent and that said Letters Patent is hereby corrected as shown below:

Column 2, line 8, after "owned" delete "lo".
Column 2, line 31, after "variety in" change "Which" to
          -- which --.

Column 6, line 35, change "extremely" to -- extremity --.

Column 7, line 6, change "sidewalls" to -- side walls --.

Column 8, line 13, after "edges on" change "a" to
          -- the --.

Signed and Sealed this

Ninth Day of March, 1993

Attest:

STEPHEN G. KUNIN

*Attesting Officer*     Acting Commissioner of Patents and Trademarks